United States Patent [19]
Kinoshita et al.

[11] Patent Number: 4,958,202
[45] Date of Patent: Sep. 18, 1990

[54] SEMICONDUCTOR LIGHT-EMITTING DEVICE AND METHOD OF MANUFACTURING THE SAME

[75] Inventors: Jun'ichi Kinoshita; Motoyasu Morinaga, both of Yokohama; Hideto Furuyama, Tokyo; Yuzo Hirayama, Yokohama, all of Japan

[73] Assignee: Kabushiki Kaisha Toshiba, Kawasaki, Japan

[21] Appl. No.: 382,345

[22] Filed: Jul. 20, 1989

Related U.S. Application Data

[63] Continuation of Ser. No. 95,114, Sep. 11, 1987.

[30] Foreign Application Priority Data

Sep. 12, 1986 [JP] Japan ................... 61-213800
Sep. 16, 1986 [JP] Japan ................... 61-215814
Sep. 30, 1986 [JP] Japan ................... 61-231852

[51] Int. Cl.5 .................. H01L 33/00; H01L 27/14
[52] U.S. Cl. .......................... 357/17; 357/30; 357/56; 372/46; 437/23; 437/127
[58] Field of Search ............ 372/46; 357/17, 41, 357/30 B, 30 E, 56; 437/23, 127

[56] References Cited

U.S. PATENT DOCUMENTS

| | | | |
|---|---|---|---|
| 4,660,208 | 4/1987 | Johnston, Jr. et al. | 372/46 |
| 4,692,927 | 9/1987 | Sawai et al. | 372/46 |
| 4,706,101 | 11/1987 | Nakamura et al. | 357/17 |
| 4,731,790 | 3/1988 | Sawai | 372/46 |
| 4,862,474 | 8/1989 | Morinaga et al. | 357/41 |
| 4,870,468 | 9/1989 | Kinoshita et al. | 357/17 |

FOREIGN PATENT DOCUMENTS

| | | | |
|---|---|---|---|
| 57-190391 | 11/1982 | Japan | 372/46 |
| 58-082587 | 5/1983 | Japan | 372/46 |
| 58-084484 | 5/1983 | Japan | 372/46 |
| 53-131784 | 8/1983 | Japan | 372/46 |
| 58-131785 | 8/1983 | Japan | 372/46 |
| 61-135181 | 6/1986 | Japan | 372/46 |

Primary Examiner—Andrew J. James
Assistant Examiner—Daniel Y. J. Kim
Attorney, Agent, or Firm—Oblon, Spivak, McClelland, Maier & Neustadt

[57] ABSTRACT

An active layer is formed on an n-type InP buffer layer of a substrate. A pair of strip-shaped grooves are formed into the active layer to divide it into a contract portion and side portions. A p-type InP cladding layer is deposited on the entire surface of the active layer and grooves. The cladding layer is selectively etched to form a mesa portion including the central active portion and expose the buffer layer. An insulating film is coated on the mesa portion and buffer layer, so that a semiconductor light-emitting device is manufactured.

6 Claims, 7 Drawing Sheets

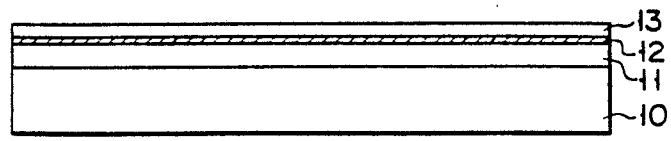
F I G. 2A
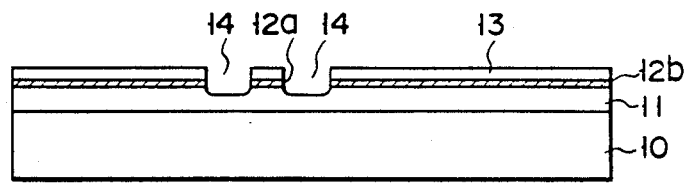
F I G. 2B
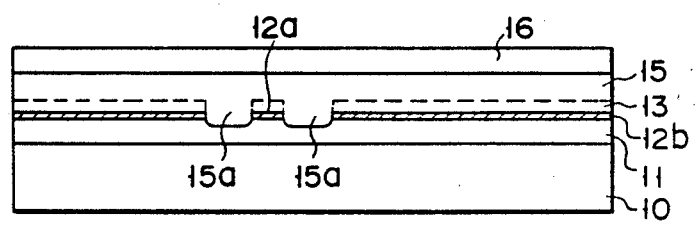
F I G. 2C
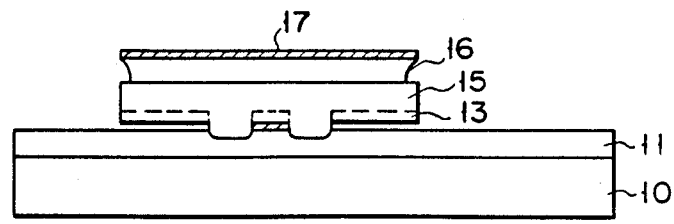
F I G. 2D
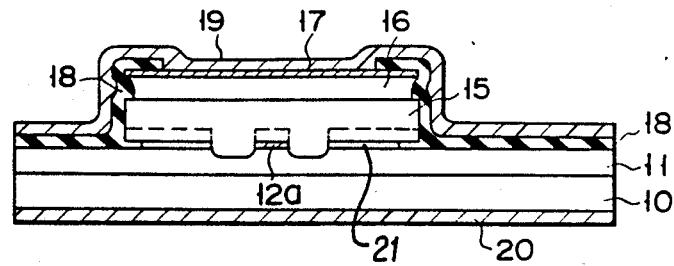
F I G. 2E

SEMICONDUCTOR LIGHT-EMITTING DEVICE AND METHOD OF MANUFACTURING THE SAME

This is a continuation of application Ser. No. 07/095,114, filed on Sept. 11, 1987.

BACKGROUND OF THE INVENTION

The present invention relates to a semiconductor light-emitting device such as a refractive index waveguide laser or a double-heterojunction light-emitting diode and a method of manufacturing the same and, more particularly, to a semiconductor light-emitting device in which an active region is surrounded by a semiconductor layer having an energy gap wider than that of the active region and a method of manufacturing the same.

Various types of semiconductor light-emitting devices having a double-heterojunction structure have recently been developed. In the semiconductor lightemitting devices of this type, it is important to satisfy the following conditions A to C.

A. A current is efficiently concentrated only in a light-emitting region or an active region which is controlled to have a very small area so as to improve a light-emitting efficiency.

B. An electrode is formed over a wide region so as to decrease the contact resistance.

C. When high-speed modulation is required as in the case of a light-emitting device for optical communication, an area of a portion where a p-n junction is formed is minimized so as to decrease a junction capacitance.

An example of a semiconductor light-emitting device for optical communication, which satisfies the above three conditions to some extent, is a mesa laser utilizing a mass transport technique, which is applied to a GaInAsP/InP semiconductor laser (e.g., Y. Hirayama et al. "Low Temperature and rapid mass transport technique for GaInAsP/InP DFB lasers, Inst. Phys. Conf. Ser. No. 79: Chapt 3 Paper presented at Int. Symp. GaAs and Related Compounds Karuizawa, Japan, 1985, p. 175–186). Such a semiconductor light-emitting device is called an MT laser. A method of manufacturing the MT laser and its characteristics will be described below with reference to the accompanying drawings.

FIGS. 1A to 1D are sectional views schematically showing steps of manufacturing a conventional MT laser. First, as shown in FIG. 1A, 3 μm-thick n-type InP buffer layer 2, 0.1 μm-thick undoped GaInAsP active layer 3 having a composition capable of emitting 1.3 μm-band light, 1.5 μm-thick p-type InP cladding layer 4, and 0.8 μm-thick p+-type GaInAsP cap layer 5 having a composition capable of emitting 1.15 μm-band light for realizing good ohmic contact are successively crystalgrown on the surface of (100) plane of n-type InP substrate 1.

Then, as shown in FIG. 1B, selective etching is performed until layer 3 is exposed to form a mesa portion having a width of 15 μm. At this time, if hydrochloric acid is used to remove layer 4, etching can be automatically stopped at layer 3 because of its selectivity.

Subsequently, as shown in FIG. 1C, both sides of layer 3 are etched by an etchant consisting of sulfuric acid + hydrogen peroxide + water (4:1:1) to form a 1 μm-wide active region. At this time, InP is almost not etched, and only quaternary GaInAsP is etched. Although layer 5 is etched, it is etched to an extent of about ⅓ that of layer 3 because of a difference between their compositions. In order to obtain stable fundamental transverse mode oscillation and a low oscillation threshold current, a width of the active region must be accurately controlled to be about 1 μm.

Thereafter, as shown in FIG. 1D, in consideration of confinement of transverse mode light and a sufficient mechanical strength, a deep constricted portion of layer 3 etched as described above is buried with an InP layer to obtain a so-called buried hetero (BH) structure. In the MT laser, an MT technique is used to grow this buried portion. That is, a phenomenon in which the InP is first grown in the constricted portion if phosphorus is added at a high temperature (670° C). Note that if InCl₃ is used as an catalyst, rapid growth can be achieved at a lower temperature.

SiO₂ film 6 as an insulating film is formed throughout the entire surface of the above element, and a window is formed at a contact portion of the insulating film. An AuZn layer is formed on layer 5 as p-side electrode 7 by a lift-off technique, and electrode 7 is heated and alloyed. Thereafter, Au-Cr is deposited on electrode 7 and film 6 to form electrode 8. In addition, n-side electrode 9 is formed on substrate 1, thereby completing the MT laser.

In this MT laser, a current can be concentrated in an active region or layer 3 by a built-in potential difference between GaInAsP of layer 3 and InP of the buried region. In addition, the junction capacitance is small because the junction is formed only at the mesa portion of a 15 μm width. Thus, the MT laser is advantageous for high-speed response. Furthermore, electrode 7 can be formed to have a width of about 10 μm.

However, the MT laser of this type has a problem of controllability with respect to a width of the active region. That is, when the 15 μm-wide active layer is to be selectively etched from the both sides to form a 1 μm-wide active region, it is difficult to stop etching of an active region at a width of 1 μm with high accuracy, and the entire active layer is sometimes etched, resulting in a poor manufacturing yield. This etching controllability becomes poor as a width of the mesa portion is increased, and a mesa width cannot be formed larger than 15 μm. Where the mesa width is 15 μm, in consideration of a mask alignment margin, a mesa width of an ohmic electrode portion must be set below 10 μm. For this reason, the contact resistance cannot be sufficiently decreased. Furthermore, since an area of the InP junction at the buried portion is defined by the width of the mesa portion, it is difficult to form the area narrower than the mesa width.

Note that although the area of the buried portion can be adjusted by controlling a time of the MT step, controllability thereof is very poor. For this reason, the width of the buried InP junction cannot be optimized, e.g., narrowed to decrease the junction capacitance while confining the transverse mode light. Therefore, it is very difficult to obtain higher performance In addition, a carrier concentration at the buried junction portion must be optimized so that the junction capacitance is decreased and a built-in potential at the junction portion is increased to decrease a current leakage, thereby obtaining a high output. However, in the conventional MT technique, since the carrier concentration is not controlled, a concentration at the junction portion cannot be defined, resulting in a serious design problem.

As described above, according to the conventional MT technique, it is difficult to set the width of the active region with high accuracy, and this difficulty prevents high performance of a buried-type semiconductor light-emitting device. In addition, when an area of the buried portion is decreased, a contact area is decreased to increase the contact resistance. Furthermore, when the contact area is increased, the buried area is increased to increase the junction capacitance, and it is difficult to control the width of the active region.

SUMMARY OF THE INVENTION

It is, therefore, an object of the present invention to provide a semiconductor light-emitting device with high performance, in which the width of the active region can be set with good controllability, the junction area and the carrier concentration of the buried portion can be optimized, the contact resistance can be decreased, and high-speed modulation can be performed, and a method of manufacturing the same.

BRIEF DESCRIPTION OF THE DRAWINGS

FIGS. 2A to 2E are sectional views for explaining steps of a method of manufacturing a semiconductor light-emitting device according to the first embodiment of the present invention in sequence;

DETAILED DESCRIPTION OF THE PREFERRED EMBODIMENTS

Figure 1A:
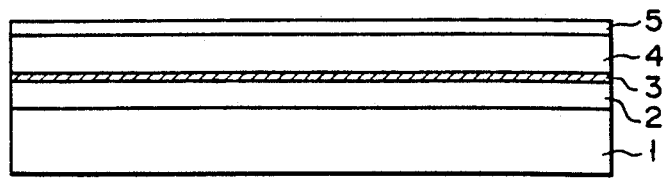
FIGS. 1A to 1D are sectional views for explaining steps of a method of manufacturing a conventional semiconductor light-emitting device in sequence.
Figure 1B:
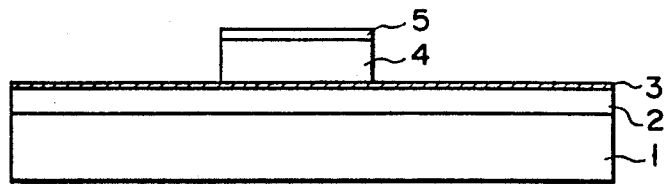
Figure 1C:
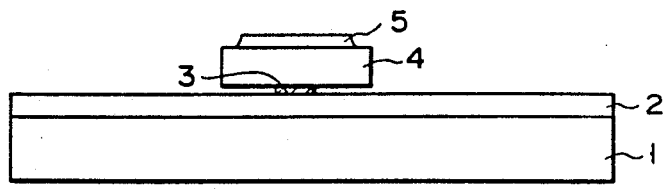
Figure 1D:
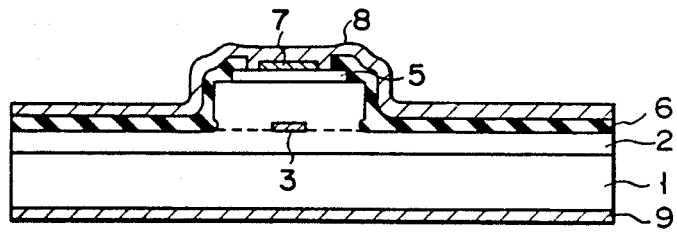

Embodiments of the present invention will be described below with reference to the accompanying drawings. Note that in the following embodiments, substantially the same parts or the members having substantially the same functions are denoted by the same reference numerals, and a repeated description thereof will be omitted.

FIGS. 2A to 2E are sectional views of the respective steps for explaining a method of manufacturing a GaInAsP/InP semiconductor laser according to the first embodiment of the present invention. First, as shown in FIG. 2A, 3 μm-thick n-type InP buffer layer (first semiconductor layer) 11 is formed on n-type InP substrate 10 having a (100) crystal face as a major surface, 0.1 μm-thick undoped GaInAsP active layer (second semiconductor layer) 12 capable of emitting 1.3 μm-band light is formed on layer 11, and 0.2 μm-thick p-type InP active layer protecting layer (third semiconductor layer) 13 is formed on layer 12.

In the next step shown in FIG. 2B, a pair of 2 μm-wide linear grooves or stripe grooves 14 for burying are formed in second and third layers 12 and 13 by channel-etching so that a width of a finally remaining portion (active region 12a) of layer 12, sandwiched between grooves 14, becomes 1 μm. Grooves 14 may or may not extend into the first layer 11. Grooves 14 divide layer 12 into central region 12a located between them and two side portions 12b located outside them. A width of region 12a is preferably about 1 μm so that stable fundamental transverse mode oscillation can be obtained. In addition, a width of each groove 14 is preferably about 2 μm so that the transverse mode light can be sufficiently confined and the junction capacitance can be decreased. However, the widths need not be limited to the above values. By setting the widths as described above, a total width of a constricted portion of a mesa portion to be formed later becomes about 5 μm to obtain a wide upper surface, so that a p-side electrode formed on the upper surface of the mesa portion can have a sufficient mechanical strength. Then, as shown in FIG. 2C, 1.5 μm-thick p-type InP cladding layer (fourth semiconductor layer) 15 is formed on the entire surface of third layer 13 and grooves 14, so that fourth layer 15 is integral with third layer 13, and 0.8 μm-thck p+-type GaInAsP cap layer 16 is formed on layer 15. As a result, a pair of projections 15a of layer 15, projecting in grooves 14, are formed to sandwich a central portion (active region 12a) of the active layer. Note that in the first embodiment, since a liquid-phase epitaxial (LPE) growth method is used for crystal growth, the final upper surface of layer 16 is flattened. This is advantageous for formation of the electrode.

Subsequently, Au-Zn electrode 17 is formed on layer 16 in a 25 μm-wide stripe manner by a lift-off technique. Electrode 17 is alloyed by a heat treatment to ohmic-contact layer 16, and both side portions of third and fourth layers 13 and 15 are etched using electrode 17 as a mask until the upper surfaces of side portions 12b of layer 12 are exposed. If hydrochloric acid is used as an etchant during removal of layers 13 and 15, etching is accurately stopped at the upper surface of side portions 12b by its etching selectivity. Thereafter, only portions (side portions 12b) of layer 12 outside projections 15a are selectively removed by an etchant consisting of sulfuric acid + hydrogen peroxide water (4 : 1 : 1), as shown in FIG. 2D. An etchant of this type does not act on InP. Therefore, lateral etching is automatically stopped at projections 15a, i.e., the buried portion between the central and side portions 12a, 12b, so that a mesa shape having a desired constricted portion can be obtained with very good reproducibility. Note that in this case, layer 16 is not so much etched because it is thicker than the active layer and its composition ratio is different therefrom.

Thereafter, SiO$_2$ film 18 is deposited on first layer 11 and an outer circumference of the mesa portion. In this case, a space between first and third layers 11, 13 is kept to be located between insulating film 18 and projection 15a. A window is formed by etching at a central portion of insulating film 18 located on the upper surface of the mesa portion to expose electrode 17. Then, Au-Cr electrode 19 is deposited on the entire surface of film 18 and the exposed portion of electrode 19. In addition, a lower portion of the resultant structure is polished until the thickness of substrate 10 becomes about 100 μm, and Au-Ge electrode 20 is formed as an n-side electrode on the polished surface, thereby completing a buried-type semiconductor laser.

In the semiconductor laser obtained in this manner, widths of region 12a and the buried portion can be controlled to be design sizes with good reproducibility. In addition, a width of electrode 17 can be set to be 25 μm to obtain sufficient ohmic contact throughout a wide area, and the contact resistance can be sufficiently decreased. Therefore, widths of the active region and the buried portion can be optimized, thereby improving the element characteristics. In addition, since the width of the active region can be accurately defined, the manufacturing yield of the element can be improved. Furthermore, since the width of the constricted portion or buried portion of the mesa portion can be narrowed, the stray capacitance can be decreased, and the response characteristics can be improved to realize high-speed modulation. Moreover, unlike in the MT technique, since crystal growth need not be performed in a narrow gap portion but can be performed in a state near a planar state, stress can be eliminated and reliability can be improved.

The second embodiment of the present invention will be described below with reference to FIGS. 3A to 3F.

Figure 3A:
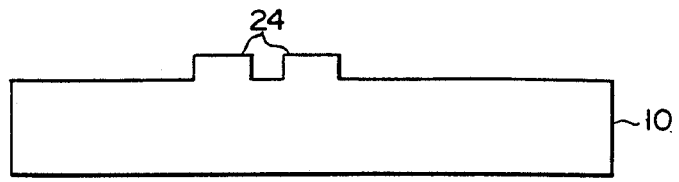
FIGS. 3A to 3F are sectional views showing the respective steps for explaining a method of manufacturing a semiconductor light-emitting device according to the second embodiment of the present invention.
Figure 3B:
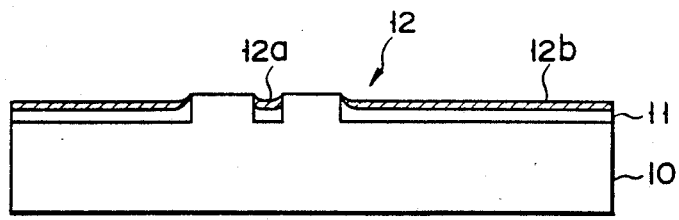

A difference between the second and first embodiments is that the width of the active layer is defined by utilizing a phenomenon that a semiconductor layer is substantially not grown on a narrow projection channeluneveness on the substrate instead of etching the active layer. That is, in the second embodiment, two narrow stripe projections 24 each having a width of 2 $\mu$m and a height of 1 $\mu$m are formed parallel to each other on n-type InP substrate 10, as shown in FIG. 3A. Thereafter, as shown in FIG. 3B, 0.5 $\mu$m-thick n-type InP buffer layer 11 and 0.1 $\mu$m-thick GaInAsP active layer 12 are sequentially crystal-grown except on the upper surfaces of ridges 24. In this state, layer 12 is formed to be divided by projections 24 into central strip portions or active region 12a accurately defined by an interval between linear projections 24 and two side portions 12b located outside ridges 24.

Figure 3C:
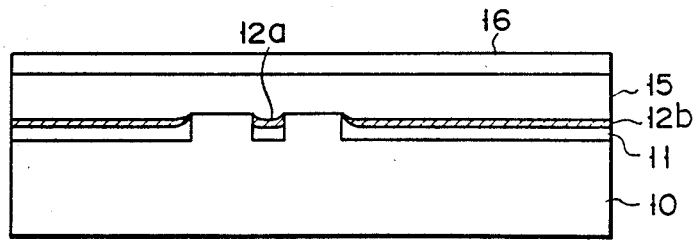
Figure 3D:
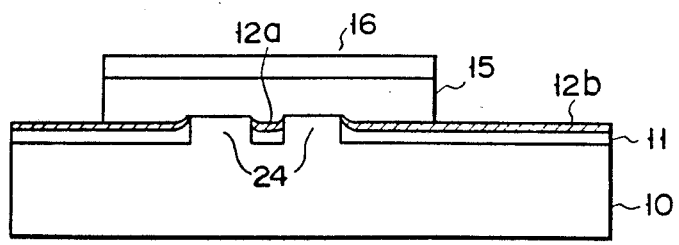
Figure 3E:
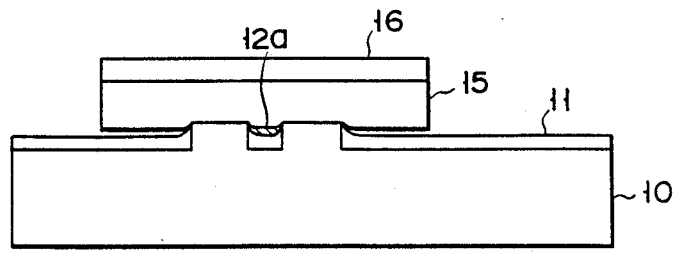

In the next step shown in FIG. 3C, 1.5 $\mu$m-thick p-type InP cladding layer (third semiconductor layer) 15 is crystal-grown throughout the entire upper surface of layer 12 and projections 24, and 0.8 $\mu$m-thick p+-type Thereafter, a mask (not shown) is formed at an upper surface central portion of layer 16, and layers 16 and 15 are mesa-etched using this mask, as shown in FIG. 3D. Thus, side portions 12b of layer 12 are exposed, and a 35 $\mu$m-wide mesa portion-including projections 24 is formed. Then, similar to the first embodiment, only side portions 12b, i.e., portions not located between projections 24, are selectively etched by an etchant consisting of sulfuric acid + hydrogen peroxide + water, as shown in FIG. 3E.

Figure 3F:
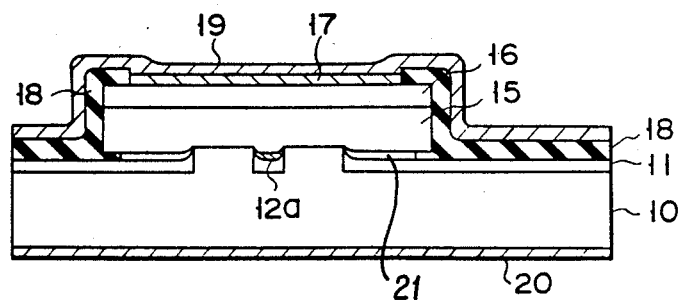

Thereafter, similar to the first embodiment, insulating film 18 and 25 $\mu$-wide Au-Zn electrode 17 are formed, and Au-Cr electrode 19 is deposited throughout the entire surfaces of electrode 17 and film 18. Then, the lower portion of the resultant structure is polished until the thickness of substrate 10 becomes about 100 $\mu$m, and Au-Ge electrode 20 as an n-side electrode is formed on the polished surface as shown in FIG. 3F, thereby completing the buried-type laser.

According to this laser, the widths of the active region and the buried portion can be controlled to be design sizes, and an area of a contact portion of layer 16 where electrode 17 is formed can be sufficiently widened. Therefore, the same effects as those of the first embodiments can be obtained.

The third embodiment of the present invention will be described below with reference to FIGS. 4A to 4E.

In this embodiment, a width of an active region is defined by utilizing a phenomenon that a growth layer is interrupted at a stepped portion of a substrate.

Figure 4A:
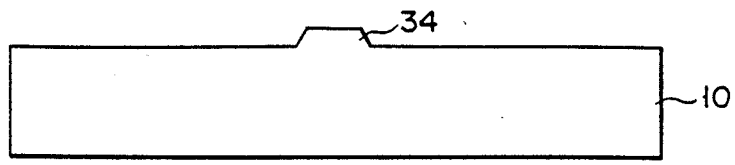
FIGS. 4A to 4E are sectional views of steps showing the third embodiment of the present invention.
Figure 4B:
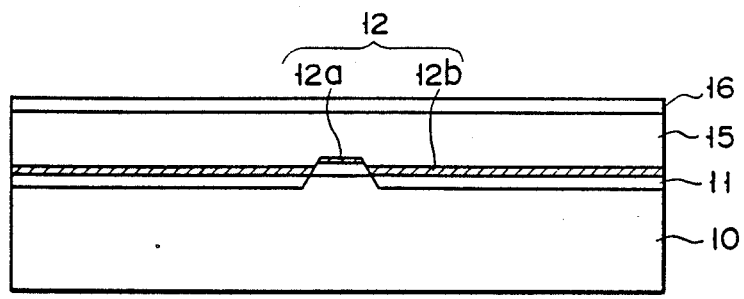

Stripe-mesa etching is performed on an upper portion of n-type InP substrate 10 having a major surface of a (100) crystal face so that stripe-shaped projection 34 is formed at a central portion thereof, as shown in u FIG. 4A. Projection 34 is formed on the major surface of substrate 10 to have a width of about 2 $\mu$m by conventional photolithography in consideration of a resist mask and side-etching for obtaining a stripe direction of a <011> direction, and is formed to have a height of 1.5 [m by an etchant consisting of hydrochloric acid + phosphoric acid (1 : 1). Then, 0.2 to 0.3 $\mu$m-thick n-type InP buffer layer 11, 0.1 $\mu$m-thick undoped GaInAsP active layer 12, 1.5 $\mu$m-thick cladding layer 15, and 0.5 to 0.8 $\mu$m-thick p+-type GaInAsP layer 16 are sequentially formed on substrate 10 by a liquid-phase growth method, as shown in FIG. 4B. Layer 12 consists of portion (active region 12a) located on the upper surface of the mesa portion and the other portions (side portions 12b). Each side portion 12b has a thickness 3 to 4 times that of region 12a and is almost not formed on the inclined side surface of the mesa portion. That is, region 12a located on the mesa portion is separated from side portions 12b by the inclined surfaces.

Figure 4C:
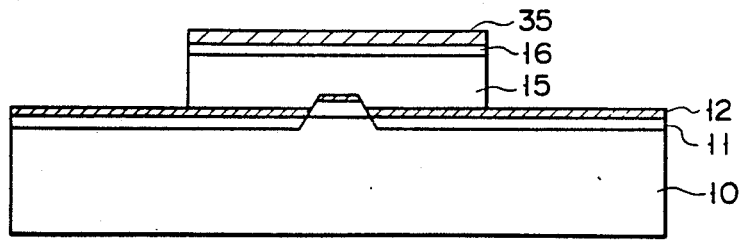
Figure 4D:
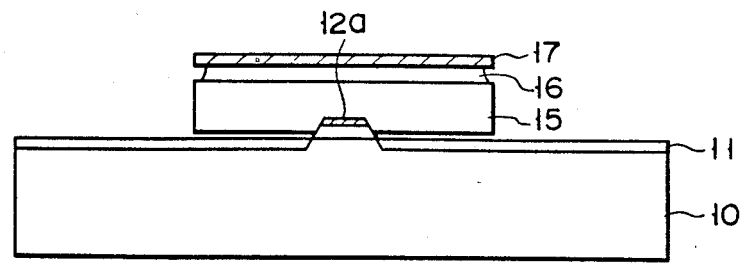

25 $\mu$m-wide SiO$_2$ film 35 is formed on the central upper surface portion of layer 16 by the CVD method, and mesa-etching of layers 16 and 15 is performed using film 35 as a mask as shown in FIG. 4C. At this time, layer 16 is etched using, e.g., Br methanol to reach the upper surface of layer 15. On the other hand, hydrochloric acid is used to etch layer 15 to automatically stop etching at the upper surface of layer 12 as shown in FIG. 4C. Thereafter, portions 12b, i.e., the portion other than region 12a on the upper surface of the mesa portion are removed by an etchant consisting of sulfuric acid + hydrogen peroxide + water, as shown in FIG. 4D. This etching is automatically stopped at the mesa portion since layer 12 is cut off thereat. Therefore, region 12a on the upper surface of the mesa portion is not removed.

Figure 4E:
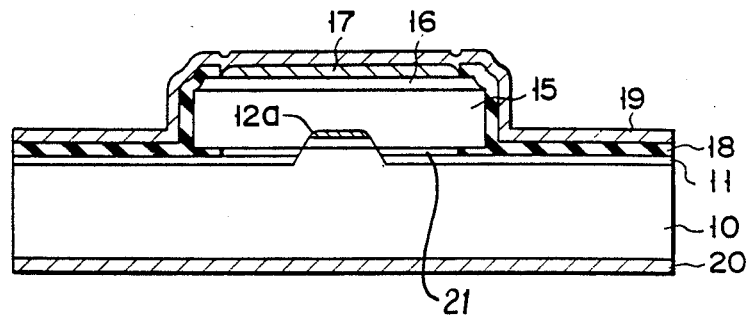

Finally, insulating film 35 is removed from layer 16, and Au-Zn electrode 17 is formed in this removed portion. Similar to the embodiments described above, insulating film 18, Au-Cr electrode 19, and electrode 20 are formed as shown in FIG. 4E, thereby completing the device. Note that if strain may occur in the active region formed in advance due to a heat treatment for ohmic-contacting electrode 17, electrode 17 may be formed instead of film 35 in the step shown in FIG. 4C.

The fourth embodiment of the present invention will be described below with reference to FIGS. 5A to 5C.

This embodiment differs from the aforementioned embodiment at the point that a step of a recess formed in a substrate is used to restrict a width of an active region, unlike the step of the projection.

Figure 5A:
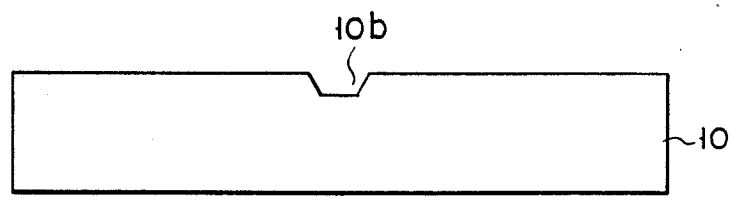
FIGS. 5A to 5C are sectional views of steps showing a method of manufacturing the fourth embodiment of the present invention.

As shown in FIG. 5A, stripe groove 10b having a width of 1 $\mu$m and a depth of 1.5 $\mu$m is formed in a central portion of a major surface of n-type InP substrate 10 having a (100) crystal face as a major surface using an etchant similar to that used in the above embodiments.

Figure 5B:
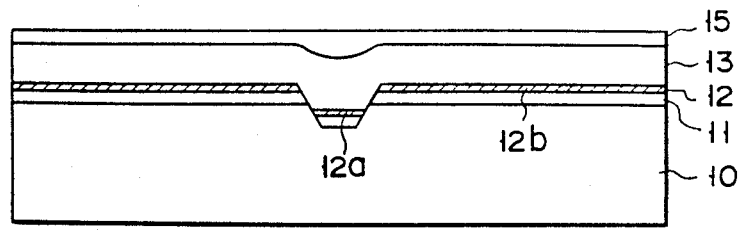

In the next step, semiconductor layer 11, active layer 12, and semiconductor layers 13 and 15 are sequentially formed by a growing method similar to that in the above embodiments, as shown in FIG. 5B. Note that since a portion (active portion 12a) formed in groove 10b of layer 12 tends to be thicker than the other portions (side portions 12b) thereof, if liquid-phase growth is used as a forming method for the layer 12, supersaturation of liquid-phase growth must be restricted.

Figure 5C:
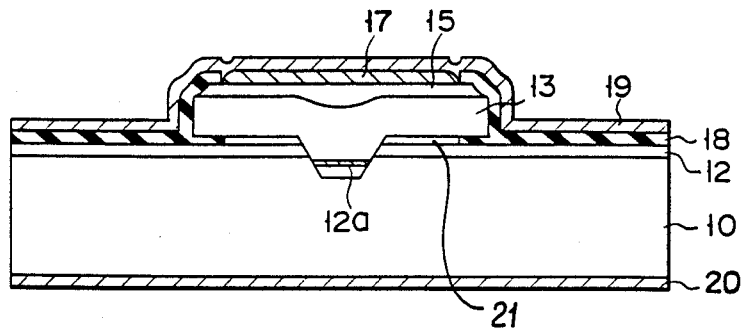

Subsequently, similar to the above embodiments, electrodes 17, 19, and 20 and insulating film 18 are formed to complete a semiconductor laser as shown in FIG. 5C.

In the embodiments described above, the n-type InP substrate is used, but a substrate in which a p-n reverse-junction is already formed may be used. This embodiment will be described with reference to FIG. 6. First, n-type InP body 60 is prepared, and 0.5 μm-thick p-type InP layer 61 and 0.2 μm-thick n-type InP layer 62 are sequentially liquid-phase grown on body 60, thereby obtaining substrate 10. Thereafter, a semiconductor laser is obtained by the same steps as those in the fourth embodiment described with reference to FIGS. 5A to 5C.

In the semiconductor laser thus obtained, a p-n reverse-junction is formed between electrodes 17 and 20 in the substrate other than a portion immediately below active region 12a. As a result, the stray capacitance can be decreased, and a current pinching effect can be improved, so that a semiconductor laser with higher efficiency can be obtained.

Figure 6:
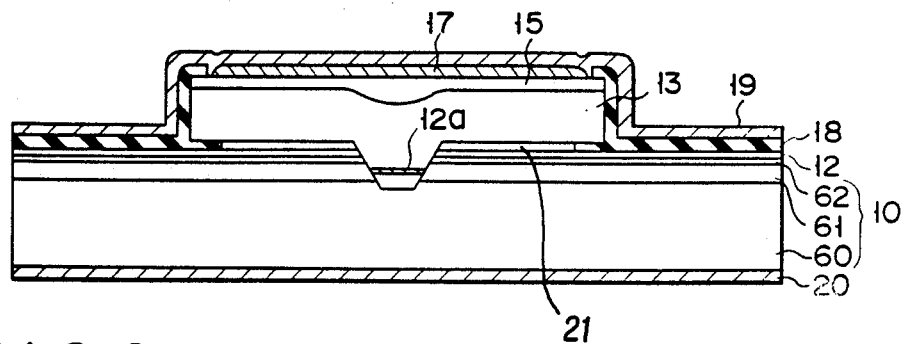
FIGS. 6 and 7 are sectional views respectively showing semiconductor light-emitting devices according to the fifth and sixth embodiments of the present invention.
Figure 7:
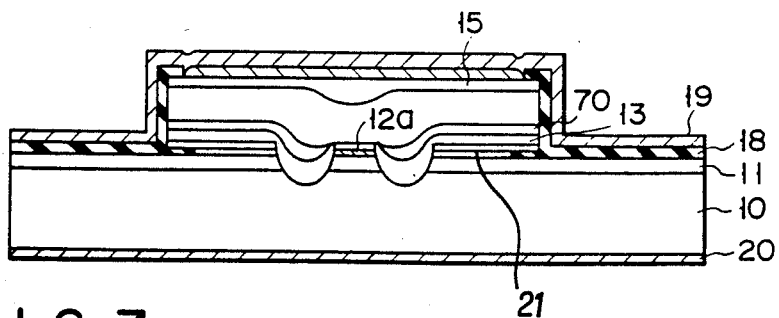

In the fifth embodiment shown in FIG. 6, the p-n reverse-junction is formed in the substrate, but it may be formed in the mesa portion as shown in FIG. 7.

In the sixth embodiment shown in FIG. 7, n-type InP current confining layer 70 is interposed between p-type InP active layer protecting layer (third semiconductor layer) 13 and p-type InP cladding layer (fourth semiconductor layer) 15. Since layer 70 is not located on active region 12a, a p-n reverse-junction is formed between layer 70 and third layer 13 except on region 12a, thereby providing the same effect as that of the fifth embodiment shown in FIG. 6.

In the embodiments described above, an oxide film is used as insulating film 18, but film 18 is nor limited to the oxide film. For example, it may be formed by heat-hardening a resin with low permittivity such as a polyimide resin. In order to form or fill such a resin layer, the following method can be adopted.

A non-hardened polyimide resin is coated around the mesa portion by a spin coating method, and a heathardening treatment is performed at a temperature of about 350° C. The polyimide resin has good characteristics as a filler, e.g., a specific resistance of about 10 Ω•cm and a permittivity of about 3.5.

The active region need not be formed with GaInAsP but may be formed with other materials, e.g., AlGaAs, or need not be formed by a single material but may be a composite layer with a layer of another material.

The semiconductor light-emitting device according to the present invention is not limited to a buried-type semiconductor laser, but can be applied to, e.g., a surface light-emitting LED. In this case, a small lightemitting diameter and a wide contact area can be obtained, thereby largely improving performance.

According to the semiconductor light-emitting device of the present invention, since a groove or a projection around an active region is accurately defined by mask alignment, a narrow active region and a wide contact region can be obtained. For this reason, the device of the present invention can provide high-speed modulation, high efficiency, high output, and low threshold current operation with stable fundamental transverse mode oscillation, small current leakage, low resistance, and small junction capacitance.

What is claimed is:

1. A semiconductor light-emitting device comprising:
   a substrate having a first semiconductor laYer of a first conductivity type;
   a mesa portion having a second semiconductor layer of a second conductivity type provided above said first semiconductor layer;
   an active region, formed between said first and second semiconductor layers, having a predetermined width, consisting of a semiconductor having an energy gap narrower than that of said first and second semiconductor layers, and contributing to emission of light;
   semiconductor regions located at both sides in a widthwise direction of said active region to be contacted with the active region, and having an energy gap wider than that of the active region;
   electrically insulating regions located at both sides in a widthwise direction of said active region, and formed between the first and second semiconductor layers; and
   first and second electrodes respectively provided on said substrate and said mesa portion.

2. A device according to claim 1, wherein said semiconductor regions include a pair of projections integrally formed with said first or second semiconductor layer, a total of widths of said active region and said pairs of projections being smaller than that of said mesa portion.

3. A device according to claim 2, which includes an insulating film formed on the peripheral surface of the mesa portion and a space formed between each projection and the insulating film.

4. A semiconductor light-emitting device comprising:
   a substrate having a first semiconductor layer of a first conductivity type;
   a mesa portion having a second semiconductor layer of a second conductivity type provided above said first semiconductor layer, the first and second semiconductor layers forming spaces therebetween which prevent flow of current between the first and second semiconductor layers;
   an active region formed between said first and second semiconductor layers and between the spaces, the active region having a predetermined width, and comprising a semiconductor having an energy gap narrower than that of said first and second semiconductor layers, and contributing to emission of light;
   semiconductor regions located at both sides in a width direction of said active region and having an energy gap wider than that of the active region, each semiconductor region including an inner surface contacted with the active region, and an outer surface which defines one side of said space; and
   first and second electrodes respectively provided on said substrate and said mesa portion.

5. The device according to claim 4 comprising, an insulating film covering the mesa portion and defining the other side on the space, whereby the space is enclosed by the first and second semiconductor layers, semiconductor region and insulating film.

6. A semiconductor light-emitting device comprising:
   a substrate having a first semiconductor layer of a first conductivity type;
   a mesa portion having a second semiconductor layer of a second conductivity type provided above said first semiconductor layer, the first and second semiconductor layers forming two material etched spaces therebetween;

an elongated active region formed between said first and second semiconductor layers and between the material etched spaces, the active region having a predetermined width and comprising a semiconductor having an energy gap narrower than that of said first and second semiconductor layers, and contributing to emission of light;

two elongated semiconductor regions located at both sides in a width direction of said active region and having an energy gap wider than that of the active region, each semiconductor region including an inner surface contacted with the active region, and an etching stop outer surface which defines one side of said material etched space and prevents the active region from being etched away; and first and second electrodes respectively provided on said substrate and said mesa portion.

* * * * *